United States Patent
Chen et al.

(10) Patent No.: US 10,236,878 B1
(45) Date of Patent: Mar. 19, 2019

(54) ISOLATOR DEVICE WITH COMMON-MODE VOLTAGE REGULATION

(71) Applicant: TEXAS INSTRUMENTS INCORPORATED, Dallas, TX (US)

(72) Inventors: Jikai Chen, Allen, TX (US); Yanli Fan, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/997,913

(22) Filed: Jun. 5, 2018

(51) Int. Cl.
- H02M 3/158 (2006.01)
- H03K 17/689 (2006.01)
- H03F 3/45 (2006.01)
- H02M 1/44 (2007.01)

(52) U.S. Cl.
CPC ............ *H03K 17/689* (2013.01); *H02M 1/44* (2013.01); *H02M 3/158* (2013.01); *H03F 3/45076* (2013.01)

(58) Field of Classification Search
CPC .. H03K 17/689; H03K 17/693; H03K 17/722; H03F 3/45071; H03F 3/45076; H02M 1/44; H02M 3/156; H02M 3/158
See application file for complete search history.

(56) References Cited

U.S. PATENT DOCUMENTS

| | | | | |
|---|---|---|---|---|
| 9,577,542 B2 * | 2/2017 | Lin | ................... | H02M 3/33592 |
| 2009/0002909 A1 * | 1/2009 | Gozun | ..................... | H02H 3/22 361/118 |
| 2018/0286612 A1 * | 10/2018 | Mantese | .............. | H01H 47/007 |

* cited by examiner

*Primary Examiner* — Matthew Nguyen
(74) *Attorney, Agent, or Firm* — John R. Pessetto; Charles A. Brill; Frank D. Cimino

(57) ABSTRACT

An isolator device (200) includes a differential transmitter, a differential receiver, and a pair of differential signal lines between the differential transmitter and the differential receiver. The isolator device also comprises isolation circuitry along the pair of differential signal lines, wherein the isolation circuitry includes a transmitter-side capacitor for each differential signal line, a receiver-side capacitor for each differential signal line, and at least one common-mode voltage regulation component.

20 Claims, 7 Drawing Sheets

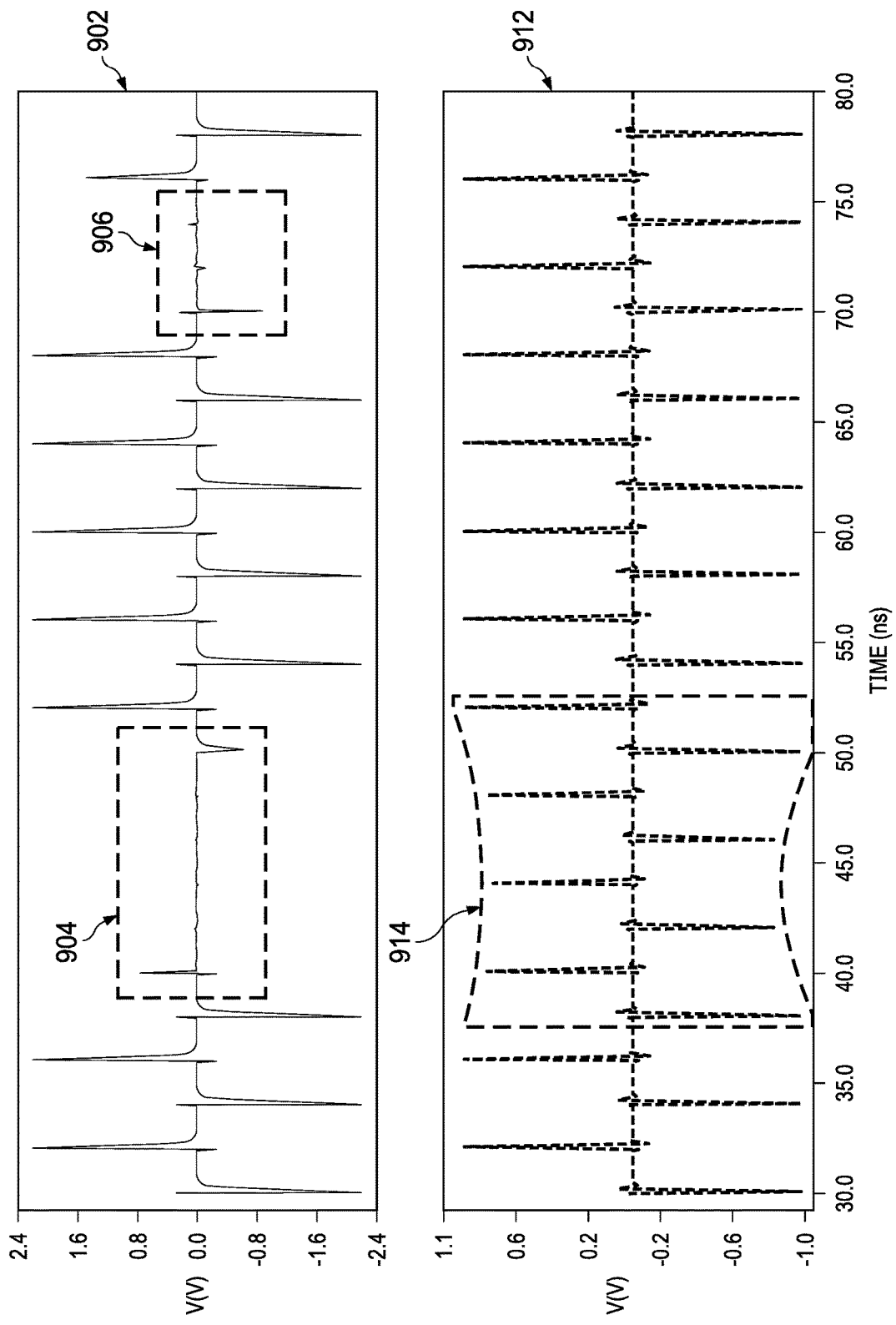

ISOLATOR DEVICE WITH COMMON-MODE VOLTAGE REGULATION

BACKGROUND

Modern electrical devices and systems employ various components, power supplies, and signaling frequencies. To reduce undesired propagation of power signals and/or communication signals in an electrical device or system, isolator devices are employed. An example isolator device enables conveyance of data and power between a high voltage circuit and a low voltage circuit while preventing hazardous direct-current from flowing in between the two circuits. Example operations performed by an isolator device include maintaining signal integrity in an electrical device or system by preventing high-frequency noise from propagating, protecting sensitive circuitry from high-voltage surges and spikes, and providing safety for human operators. To ensure human safety, industrial standards require reinforced isolation—that is, twice the basic level of isolation needed for proper operation of the equipment. The performance of isolator devices to convey signals suffers due to parasitic capacitances and common-mode current transients. Efforts to improve isolator device performance are ongoing.

SUMMARY

In accordance with at least one example of the disclosure, an isolator device comprises a differential transmitter, a differential receiver, and a pair of differential signal lines between the differential transmitter and the differential receiver. The isolator device also comprises isolation circuitry along the pair of differential signal lines, wherein the isolation circuitry includes a transmitter-side capacitor for each differential signal line, a receiver-side capacitor for each differential signal line, and at least one common-mode voltage regulation component.

In accordance with at least one example of the disclosure, an isolator device comprises a transmitter-side integrated circuit with a differential transmitter, a pair of differential transmitter signal lines, and a transmitter-side isolation capacitor for each differential transmitter signal line. The isolator device also comprises a receiver-side integrated circuit with a differential receiver, a pair of differential receiver signal lines, and a receiver-side isolation capacitor for each differential receiver signal line. The isolator device comprises conductive wires between the transmitter-side integrated circuit and the receiver-side integrated circuit to couple the pair of differential transmitter signal lines to the pair of differential receiver signal lines. The isolator device also comprises at least one common-mode voltage regulation component.

In accordance with at least one example of the disclosure, an isolator device comprises a differential transimpedance amplifier (TIA) circuit having, for each of two differential signal lines, a TIA transistor with a control terminal, a first current terminal, and a second current terminal. The control terminal of the TIA transistor couples to a voltage supply node via a resistor. The first current terminal of the TIA transistor couples to a voltage supply node. The second current terminal of the TIA transistor couples to a current source, a differential output signal node, and a differential input signal node via another resistor. The isolator device also comprises a common-mode servo circuit having, for each of the two differential signal lines, a first servo transistor, a second servo transistor, and a third servo transistor.

BRIEF DESCRIPTION OF THE DRAWINGS

For a detailed description of various examples, reference will now be made to the accompanying drawings in which:

FIG. 9 shows a graph comparing receiver output signals for isolator devices with and without common-mode voltage regulation in accordance with various examples.

DETAILED DESCRIPTION

The disclosed examples are directed to isolator devices with common-mode (CM) voltage regulation. In various examples, disclosed isolator devices correspond to differential signal isolator devices, where isolator circuitry is employed along each of two differential signal lines. In some examples, CM voltage regulation in an isolator device is performed by a transmitter-side CM servo and/or a receiver-side CM servo, where each CM servo comprises an active servo loop configured to detect CM transients and to source or sink current in response to a detected CM transient. In some examples, CM voltage regulation in an isolator device is performed by a transmitter-side CM choke and/or a receiver-side CM choke, where each CM choke comprises a passive component for each differential signal line to suppress CM transients at frequencies above a predetermined threshold. In some examples, a transmitter-side CM choke corresponds to a pair of inductors, where each inductor couples to a respective differential signal line. Likewise, in some examples, a receiver-side CM choke corresponds to a pair of inductors, where each inductor couples to a respective differential signal line. To reduce parasitic capacitance in an isolator device (which improves signal strength), at least some disclosed isolator devices employ a differential receiver with a transimpedance amplifier (TIA) topology. The TIA topology has a low-impedance input, which reduces the effect of parasitic capacitances in an isolator device (parasitic capacitances are effectively bypassed in an isolator device when using a receiver with a low-impedance input). To provide a better understanding, various isolator device options, scenarios, and details are described using the figures as follows.

Figure 1:
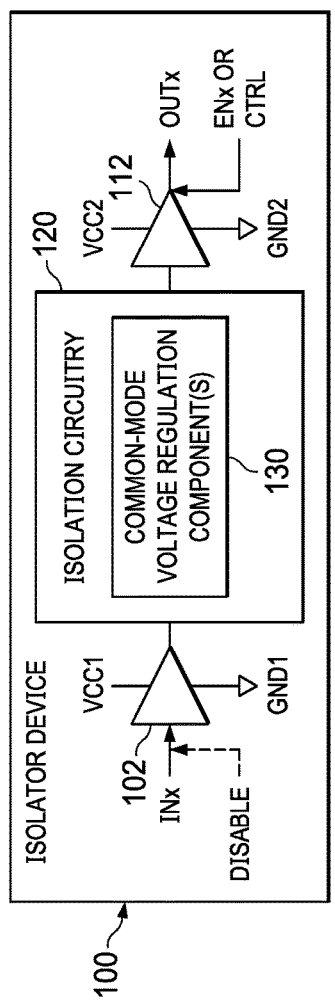
FIG. 1 shows a block diagram of an isolator device in accordance with various examples.

FIG. 1 shows a block diagram of an isolator device 100 in accordance with various examples. As shown, the isolator device 100 includes a transmitter 102 with a transmitter-side voltage supply (VCC1) and a transmitter-side ground (GND1). In different examples, the number of input channels (INx) for the transmitter 102 varies. Also, in some examples, input channels of the transmitter 102 are selectively enabled or disabled. The isolator device 100 also includes a receiver 112 with a receiver-side voltage supply (VCC2) and a receiver-side ground (GND2). In different examples, the number of output channels (OUTx) for the receiver 112 varies. Also, in some examples, output channels of the receiver 112 are selectively enabled or disabled.

Between the transmitter 102 and the receiver 112, the isolator device 100 employs isolation circuitry 120. The isolation circuitry 120 represented in FIG. 1 has two functions. The first function is to prevent direct-current (DC) flows between transmitter-side components and receiver-side components that would otherwise occur due to VCC1 and GND1 being different than VCC2 and GND2. This first function is known in the art. The second function is to regulate CM voltages and thus the isolation circuitry 120 includes CM voltage regulation component(s) 130. This second function represents an improvement over existing isolator devices. In different examples, the CM voltage regulation component(s) 130 include at least one of a transmitter-side CM servo, a transmitter-side CM choke, a receiver-side CM servo, and a receiver-side CM choke. Also, for some examples of the isolator device 100, the receiver 112 has a TIA topology to reduce the effect of parasitic capacitances in the isolator device 100.

Figure 2:
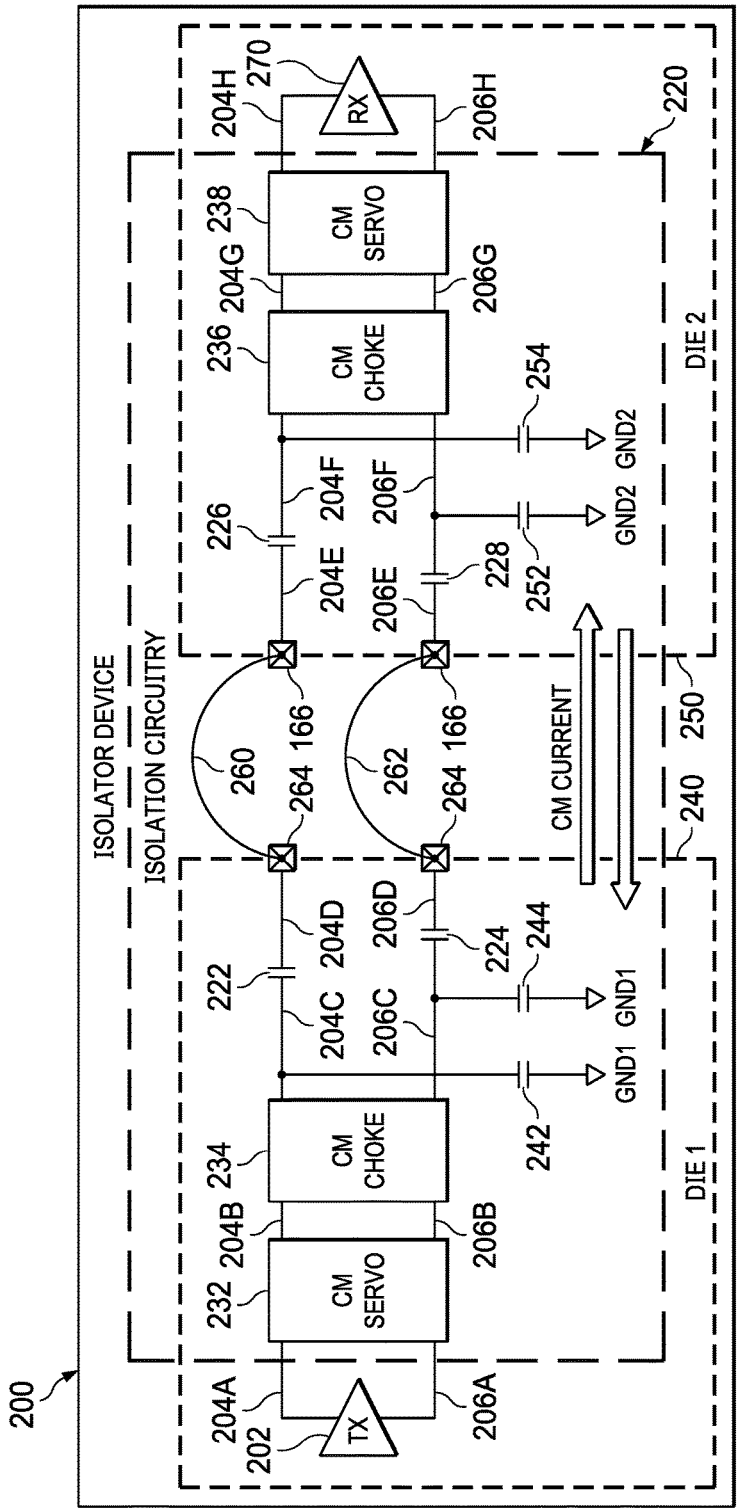
FIG. 2 shows components of an isolator device in accordance with various examples.

FIG. 2 shows components of an isolator device 200 in accordance with various examples. The isolator device 200 of FIG. 2 is an example of the isolator device 100 of FIG. 1. As shown, the isolator device 200 includes a differential transmitter 202 that is part of a first die 240 and a differential receiver 270 that is part of a second die 250. In operation, the differential transmitter 202 conveys signals to the differential receiver 270 using differential signal lines 204 and 206 (labeled as 204A-204H and 206A-206H to specify different segments) and isolation circuitry 220. The isolation circuitry 220 of FIG. 2 is an example of the isolation circuitry 120 of FIG. 1. In operation, the isolation circuitry 220 prevents DC current flows between the first die 240 and the second die 250, and regulates CM voltages as described herein.

For the isolator device 200 of FIG. 2, the isolation circuitry 220 is divided between the first die 240 and the second die 250 with components included with the first die 240 being referred to as transmitter-side components. Meanwhile, components of the isolation circuitry 220 that are included with the second die 250 are referred to as receiver-side components. More specifically, the isolation circuitry 220 includes a transmitter-side CM servo 232, a transmitter-side CM choke 234, a receiver-side CM choke 236, and a receiver side 238 servo. The transmitter-side CM servo 232, the transmitter side CM choke 234, the receiver-side CM choke 236, and the receiver-side CM servo 238 are examples of the CM voltage regulation components 130 in FIG. 1. The isolation circuitry 220 also includes transmitter-side isolation capacitors 222, 224 and receiver-side isolation capacitors 226, 228 along the respective differential signal lines 204 and 206. To couple the first die 240 and the second die 250 together, bond wires 260 and 262 are used.

More specifically, a first differential signal line segment 204A is represented between the differential transmitter 202 and the transmitter-side CM servo 232 on the first die 240. Between the transmitter-side CM servo 232 and the transmitter-side CM choke 234 is another first differential signal line segment 204B. Between transmitter-side CM choke 234 and the transmitter-side isolation capacitor 222 is another first differential signal line segment 204C. Between the other side of the transmitter-side isolation capacitor 222 and the bond wire 260 is another first differential signal line segment 204D. The bond wire 260 extends the first differential signal line 204 from the first die 240 to the second die 250, where another first differential signal line segment 204E is between the bond wire 260 and the receiver-side isolation capacitor 226. Between the other side of the receiver-side isolation capacitor 226 and the receiver-side CM choke 236 is another first differential signal line segment 204F. Between the receiver-side CM choke 236 and the receiver-side CM servo 238 is another first differential signal line segment 204G. Between the receiver-side CM servo 238 and the differential receiver 270 is another first differential signal line segment 204H.

Similarly, a second differential signal line segment 206A is represented between the differential transmitter 202 and the transmitter-side CM servo 232 on the first die 240. Between the transmitter-side CM servo 232 and the transmitter-side CM choke 234 is another second differential signal line segment 206B. Between transmitter-side CM choke 234 and the transmitter-side isolation capacitor 224 is another second differential signal line segment 206C. Between the other side of the transmitter-side isolation capacitor 224 and the bond wire 262 is another first differential signal line segment 206D. The bond wire 262 extends the second differential signal line 206 from the first die 240 to the second die 250, where another second differential signal line segment 206E is between the bond wire 262 and the receiver-side isolation capacitor 228. Between the other side of the receiver-side isolation capacitor 228 and the receiver-side CM choke 236 is another second differential signal line segment 206F. Between the receiver-side CM choke 236 and the receiver-side CM servo 238 is another second differential signal line segment 206G. Between the receiver-side CM servo 238 and the differential receiver 270 is another second differential signal line segment 206H.

For the isolator device 200, transmitter-side parasitic capacitors 242 and 244 are represented as being coupled between respective first differential signal lines segments 204C and 206C of the first die 240 and a transmitter-side ground (GND1). Similarly, receiver-side parasitic capacitors 242 and 244 are represented as being coupled between respective first differential signal lines segments 204F and 206F of the second die 250 and a receiver-side ground (GND2). The parasitic capacitors 242, 244, 252, and 254 are due to imperfect materials and component design. While some parasitic capacitance is tolerable in a communication system, high-frequency signaling between the differential transmitter 202 and the differential receiver 270 is affected to a higher degree. In at least some examples, the differential receiver 270 for the isolator device 200 has a transimpedance amplifier (TIA) topology that provides a low-impedance receiver input that effectively bypasses parasitic capacitors 242, 244, 252, and 254.

The differential signal line 204 represented by segments 204A-204H and the differential signal line 206 represented by segments 206A-206H enable signaling between the differential transmitter 202 and differential receiver 270, where isolation capacitors 222, 224, 226, and 228 prevent DC voltages from passing between the first and second dies 240 and 250. Also, CM transients along the differential signal lines 204 and 206 are regulated by the transmitter-side CM servo 232, the transmitter-side CM choke 234, the receiver-side CM choke 236, and the receiver-side CM servo 238, which facilitates processing of signals conveyed from the differential transmitter 202 to the differential receiver 270. In some examples, the effect of parasitic capacitances (e.g., parasitic capacitances 242, 244, 252, 254) along the differential signal lines 204 and 206 is reduced by use of a TIA topology for the differential receiver 270, which improves the strength of signals received by the differential receiver 270.

Figure 3:
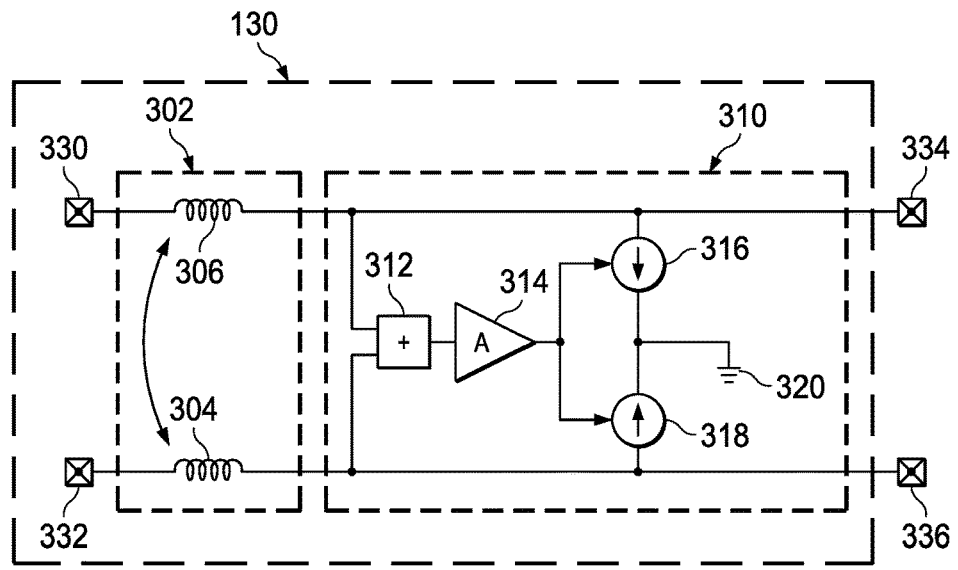
FIG. 3 shows a schematic diagram of common-mode voltage regulation components in accordance with various examples.

FIG. 3 shows a schematic diagram of CM voltage regulation components 130 in accordance with various examples. As shown, the CM voltage regulation components 130 include a CM choke 302 and a CM servo 310. The CM choke 302 includes inductors 304 and 306 (one for each of two differential signal lines) that operate to suppress common-mode transients at frequencies above a predetermined threshold. Meanwhile, the CM servo 310 corresponds to an active servo loop that includes an adder 312 coupled between two differential signal lines. If the output of the adder 312 is zero, the CM servo 310 does not need to take any corrective action. If the output of the adder 312 is not zero, this output is amplified by an amplifier 314, and is used to direct a current source 316 and/or a current source 318 to sink current from or source current to one or both of the differential signal lines. In this manner, CM voltages along the differential signal lines are regulated.

In some examples, the CM voltage regulation components 130 represented in FIG. 3 are transmitter-side components coupled between isolation capacitors (e.g., capacitors 222 and 224) and a differential transmitter (e.g., differential transmitter 202) at respective connection points 330, 332, 334, and 336. In other examples, the CM voltage regulation components 130 represented in FIG. 3 are receiver-side components coupled between isolation capacitors (e.g., capacitors 226 and 228 in FIG. 2) and a differential receiver (e.g., differential receiver 270 in FIG. 2) at respective connection points 330, 332, 334, and 336. In some examples, the CM voltage regulation components 130 represented in FIG. 3 are only used in a transmitter-side die (e.g., die 240 of FIG. 2). In some examples, the CM voltage regulation components 130 represented in FIG. 3 are only used in a receiver-side die (e.g., die 250 of FIG. 2). In some examples, the CM choke 302 or the CM servo 310 represented in FIG. 3 is omitted. Thus, in different examples, CM voltage regulation components 130 include one or more of a transmitter-side CM servo, a transmitter-side CM choke, a receiver-side CM choke, and a receiver-side CM servo.

Figure 4A:
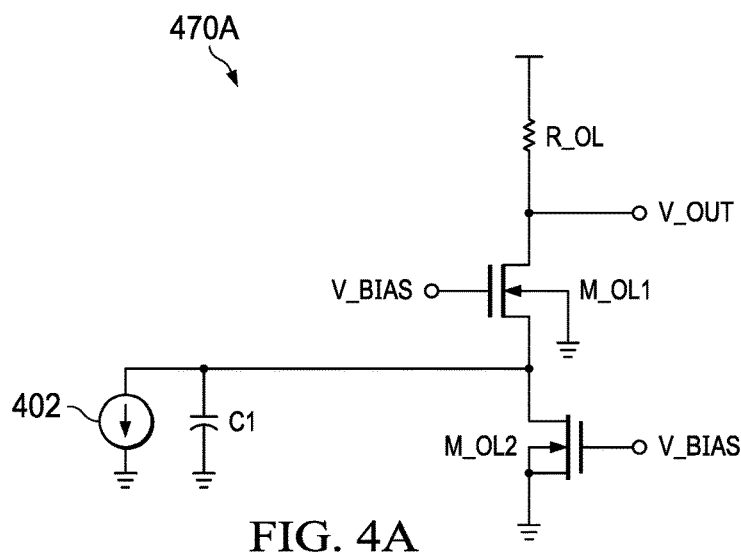
FIGS. 4A and 4B show transimpedance amplifier (TIA) topologies in accordance with various examples.
Figure 4B:
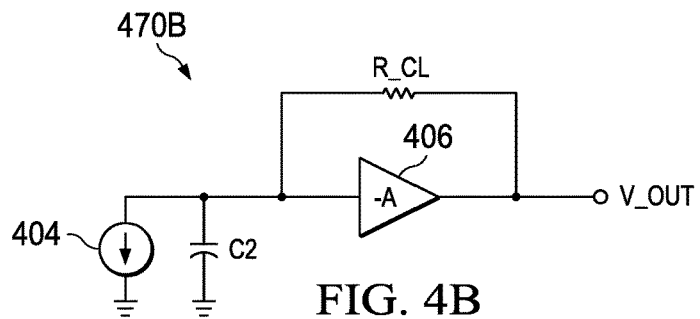

FIGS. 4A and 4B show TIA topologies in accordance with various examples. In FIG. 4A, an open-loop TIA topology 470A is represented. The open-loop TIA topology 470A includes two transistors M_OL1 and M_OL2 with respective control terminals coupled to a bias voltage node (V_BIAS). A current source 402 in parallel with a capacitor (C1) couple to one of the current terminals for each of M_OL1 and M_OL2. The other current terminal for M_OL2 couples to ground. Meanwhile, the other current terminal for M_OL1 couples to a voltage supply via a resistor (R_OL). In operation, the voltage at M_OL1's upper current terminal corresponds to the output voltage (V_OUT) for the open-loop TIA topology 470A.

In FIG. 4B, a closed-loop TIA topology 470B is represented. The closed-loop TIA topology 470B includes an amplifier 406. A current source 404 in parallel with a capacitor (C2) couple to the input of the amplifier 406. The output of the amplifier 406 is fed back to the input of the amplifier 406 via a resistor (R_CL). The output of the amplifier 406 corresponds to the output voltage (V_OUT) for the closed-loop TIA topology 470B.

In some examples, the differential receiver 270 represented in FIG. 2 employs an open-loop TIA topology such as topology 470A. In other examples, the differential receiver 270 represented in FIG. 2 employs a closed-loop TIA topology such as topology 470B. For differential signaling scenarios, the open-loop TIA topology 470A or the closed-loop TIA topology 470B is replicated for each differential signal line. In different examples, the open-loop TIA topology 470A and/or the closed-loop TIA topology 470B vary with regard to the specific components, components values, and/or arrangement of components employed. Also, it should be appreciated that for some isolator devices that employ isolation circuitry 130, the differential receiver 270 does not use a TIA topology.

Figure 5:
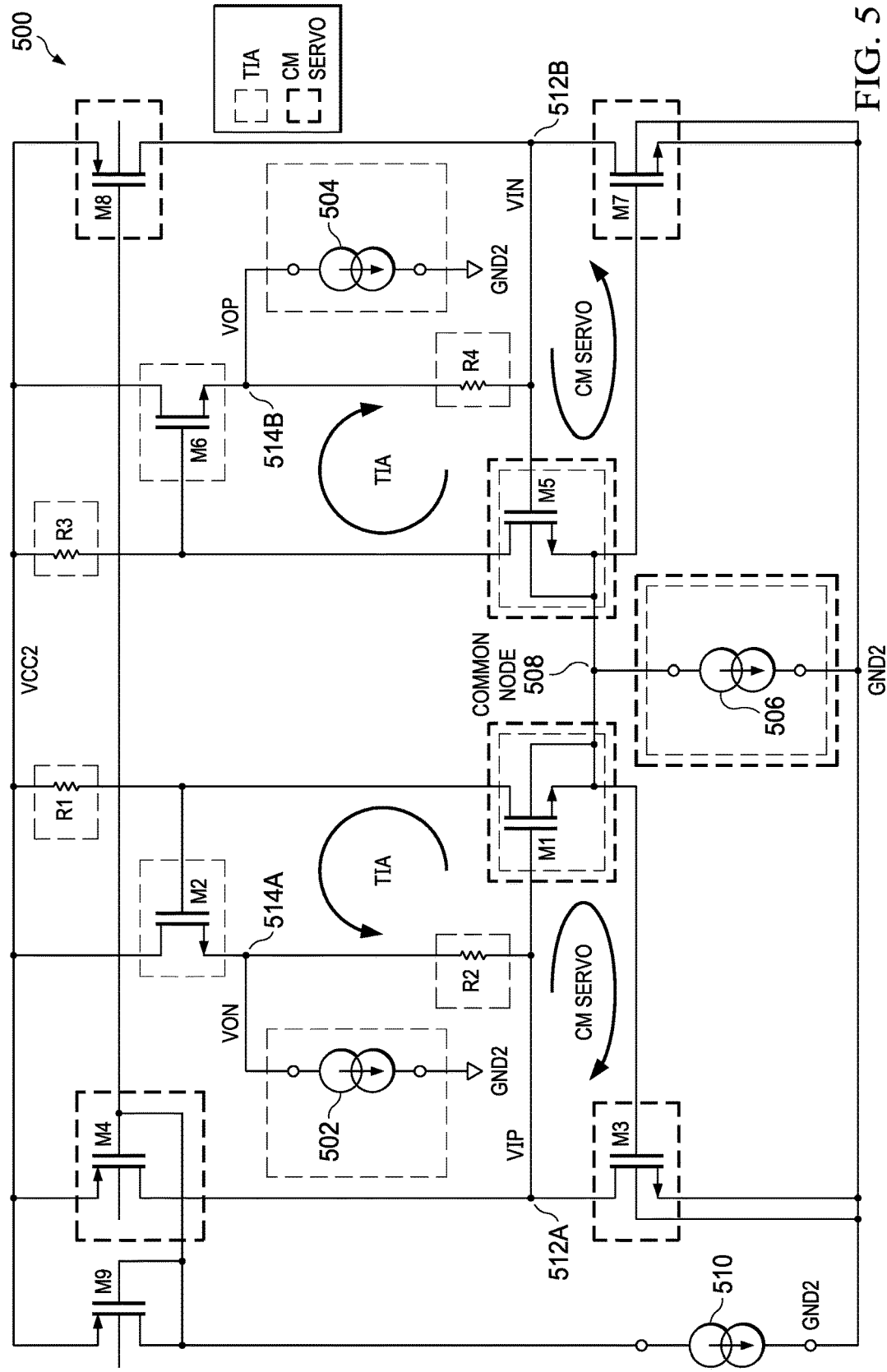
FIG. 5 shows a schematic diagram of receiver-side circuitry in accordance with various examples.

FIG. 5 shows a schematic diagram for receiver-side circuitry 500 in accordance with various examples. As shown, the receiver-side circuitry 500 includes some components identified as being part of a differential TIA circuit and some components identified as being part of a CM servo circuit. More specifically, the differential TIA circuit in the receiver-side circuitry 500 includes first and second TIA transistors (M1 and M2), each with a control terminal, a first current terminal, and a second current terminal. The control terminal of M1 couples to an input signal node 512A. The first current terminal of M1 couples to a voltage supply node (VCC2) via a resistor (R1). The second current terminal of M1 couples to a common-node 508 and common-node current source 506 for the receiver-side circuit 500. Meanwhile, the control terminal of M2 couples to VCC2 via R1. Meanwhile, the first current terminal of M2 couples to VCC2. Also, the second current terminal of M2 couples to a current source 502, an output signal node 514A, and the input signal node 512A via another resistor (R2). In operation, the above-noted arrangement of differential TIA circuit components M1, M2, R1, and R2, enables amplification of a first input differential signal (VIP) received at the input signal node 512A, resulting in a first output differential signal (VON) at the output signal node 514A. Without limitation, M1, M2, R1, and R2 represent half of a differential TIA circuit in FIG. 5, where a closed-loop TIA topology is employed (see e.g., closed-loop TIA topology 470B in FIG. 4B).

The value of VIP at the differential input signal node 512A is controlled in part by CM servo circuit components including a first CM servo transistor (M1), a second CM servo transistor (M3), and a third CM servo transistor (M4). M1 has a control terminal coupled to the differential input signal node 512A, a first current terminal coupled to VCC2 via R1, and a second current terminal coupled to the common-node current source 506. M3 has a control terminal coupled to the second current terminal of M1, a first current terminal coupled to the input signal node 512A, and a second current terminal coupled to a ground node (GND2). M4 has a control terminal coupled to a bias circuit corresponding to a bias transistor (M9) and a current source 510 coupled to GND2. A first current terminal of M4 couples to VCC2, and a second current terminal of M4 couples to the input signal node 512A. In operation, the above-noted arrangement of differential CM servo circuit components M2, M3, and M4, enables current to be sourced to or sunk from the input signal node 512A, resulting in CM voltage regulation of VIP. Without limitation, M2, M3, and M4 represent half of a CM servo circuit in FIG. 5.

The receiver-side circuitry 500 also includes third and fourth TIA transistor (M5 and M6), each with a control terminal, a first current terminal, and a second current terminal. The control terminal of M5 couples to an input signal node 512B. The first current terminal of M5 couples to VCC2 via a resistor (R3). The second current terminal of M5 couples to the common-node current source 506. Meanwhile, the control terminal of M6 couples to VCC2 via R3. Meanwhile, the first current terminal of M6 couples to VCC2. Also, the second current terminal of M6 couples to a current source 504, a differential output signal node 514B, and the differential input signal node 512B via another resistor (R4). In operation, the above-noted arrangement of differential TIA circuit components M5, M6, R3, and R4, enables amplification of a second input differential signal (VIN) at the input signal node 512B, resulting in a second output differential signal (VOP) at the output signal node 514B. Without limitation, M5, M6, R3, and R4, represent half of a differential TIA circuit in FIG. 5 (the other half corresponding to M1, M2, R1, and R2), where a closed-loop TIA topology is employed (see e.g., closed-loop TIA topology 470B in FIG. 4B).

The value of VIN at the input signal node 512B is controlled in part by CM servo circuit components including a fourth CM servo transistor (M6), a fifth CM servo transistor (M7), and a sixth CM servo transistor (M8). M6 has a control terminal coupled to the input signal node 512B, a first current terminal coupled to VCC2 via R3, and a second current terminal coupled to the common-node current source 506. M7 has a control terminal coupled to the second current terminal of M6, a first current terminal coupled to the input signal node 512B, and a second current terminal coupled to GND2. M8 has a control terminal coupled to a bias circuit corresponding to M9 and a current source 510 coupled to GND2. A first current terminal of M8 couples to VCC2, and a second current terminal of M8 couples to the differential input signal node 512B. In operation, the above-noted arrangement of CM servo circuit components M6, M7, and M8, enables current to be sourced to or sunk from the input signal node 512B, resulting in CM voltage regulation of VIN. Without limitation, M6, M7, and M8 represent half of a CM servo circuit in FIG. 5 (the other half corresponding to M2, M3, and M4).

The receiver-side circuitry 500 represented in FIG. 5 is an example of a differential signaling circuit that provides first and second output signals (VON and VOP) based on first and second input signals (VIP and VIN), where TIA circuit components (e.g., M1, M2, M5, M6, R1-R4) manage amplification operations with low input-impedance at the input signal nodes 512A and 512B, and where CM servo circuit components (e.g., M1, M3, M4, M5, M7, M8) manage common-mode voltage regulation as described herein. In FIG. 5, the various transistors (M1-M8) are represented as metal-oxide semiconductor field-effect transistors (MOSFETs). In other examples, receiver-side circuitry such as receiver-side circuitry 500 employs at least some bipolar transistors and/or other transistor types instead of MOSFETs.

For different examples of the receiver-side circuitry 500, it should be appreciated that the connections and nodes represented vary with regard to their implementation. In other words, the receiver-side circuitry 500 of FIG. 5 is a schematic diagram showing various parts and connections without limitation on how the connections are implemented. In one example, VCC2 in FIG. 5 corresponds to one node or voltage supply line to supply various components of the receiver-side circuitry 500 with the same voltage level. In another example, VCC2 corresponds to multiple nodes and/or voltage supply lines that provide various components of the receiver-side circuitry 500 with the same voltage level. Likewise, GND2 corresponds to one or more ground nodes and/or ground lines. Likewise, each of the input signal nodes 512A and 512B corresponds to one or more input signal nodes and/or signal lines.

In some examples, the receiver-side circuitry 500 (CM servo circuit components and differential TIA circuit components) is combined with receiver-side CM choke components. Additionally or alternatively, in some examples, the receiver-side circuitry 500 is combined with transmitter-side CM choke components. Additionally or alternatively, in some examples, the receiver-side circuitry 500 is combined with transmitter-side CM servo components.

Figure 6:
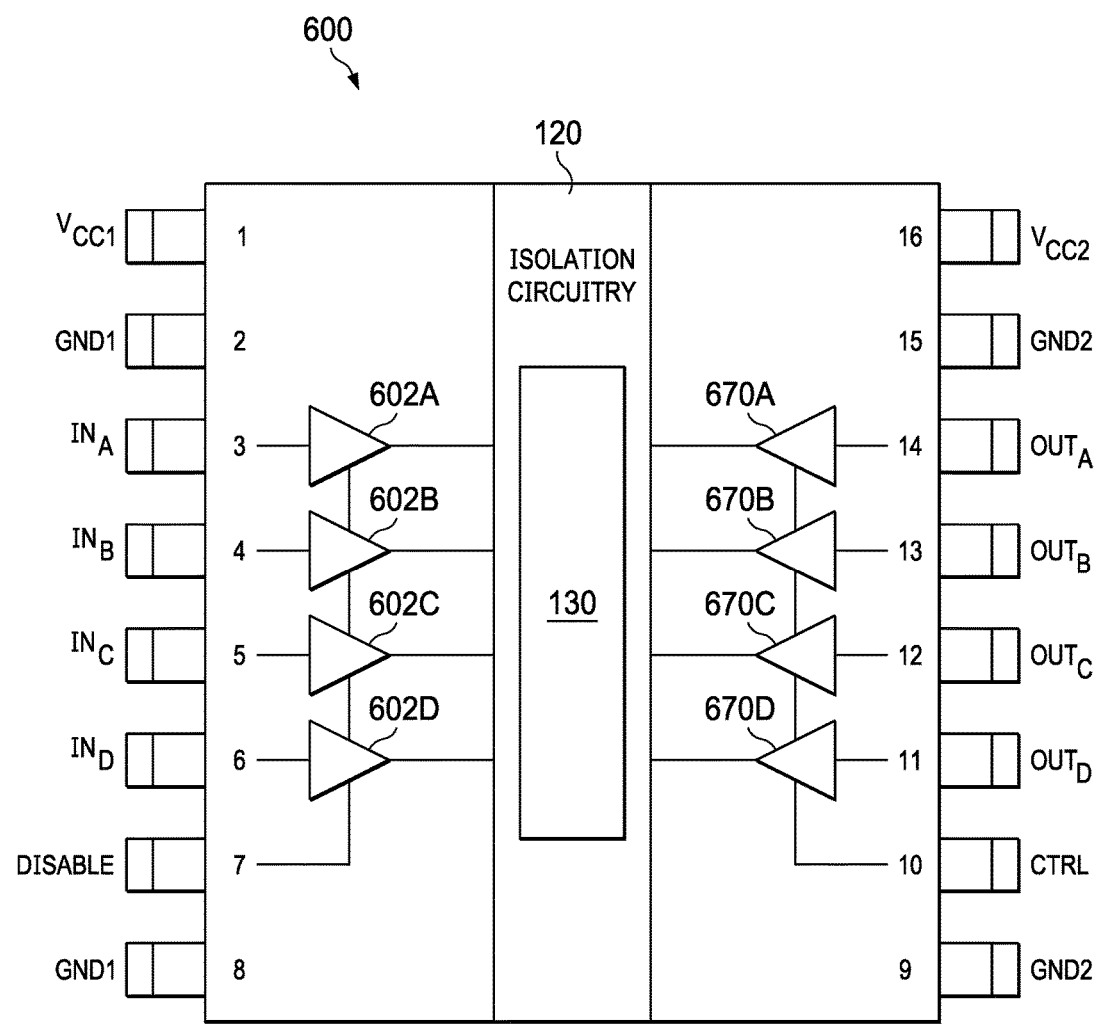
FIG. 6 shows an isolator device layout in accordance with various examples.

FIG. 6 shows an isolator device layout 600 in accordance with various examples. In the layout 600, an isolator device with four input channels ($IN_A$-$IN_D$) and four output channels ($OUT_A$-$OUT_D$) is represented. Accordingly, the layout 600 includes four transmitters 602A-602D (e.g., each an example of transmitter 102 in FIG. 1 or differential transmitter 202 in FIG. 2) and four receivers 670A-670D (e.g., each an example of receiver 112 in FIG. 1 or differential receiver 270 in FIG. 2). The layout also includes isolation circuitry 120 between the transmitters 602A-602D and the receivers 670A-670D. The isolation circuitry 120 includes isolation capacitors and CM voltage regulation components 130, as described herein, for each signal line between the transmitters 602A-602D and the receivers 670A-670D.

The layout 600 also includes various pins to couple the internal components of the isolator device corresponding to layout 600 with external components or signals. More specifically, the pins include a VCC1 pin, a first GND1 pin, an $IN_A$ pin, an $IN_B$ pin, an $IN_C$ pin, an $IN_D$ pin, a DISABLE pin, a second GND1 pin, a first GND2 pin, a CTLR pin, an $OUT_D$ pin, an $OUT_C$ pin, an $OUT_B$ pin, an $OUT_A$ pin, a second GND2 pin, and a VCC2 pin. The VCC1 pin is configured to receive a transmitter-side voltage supply signal. The first and second GND1 pins are configured to couple to a transmitter-side ground. The $IN_A$-$IN_D$ pins are configured to couple to respective transmitter-side input channels (from one or more other components). The DISABLE pin enables one or more of the transmitter-side input channels corresponding to $IN_A$-$IN_D$ to be enabled or disabled based on an external signal. The VCC2 pin is configured to receive a receiver-side voltage supply signal. The first and second GND2 pins are configured to couple to a receiver-side ground. The $OUT_A$-$OUT_D$ pins are configured to couple to respective receiver-side output channels. The CTLR pin enables one or more of the receiver-side output channels corresponding to $OUT_A$-$OUT_D$ to be enabled or disabled based on an external signal. In different examples, an isolator device (with CM voltage regulation components as described herein) has more input channels or less input channels than the layout 600 represented in FIG. 6.

Figure 7:
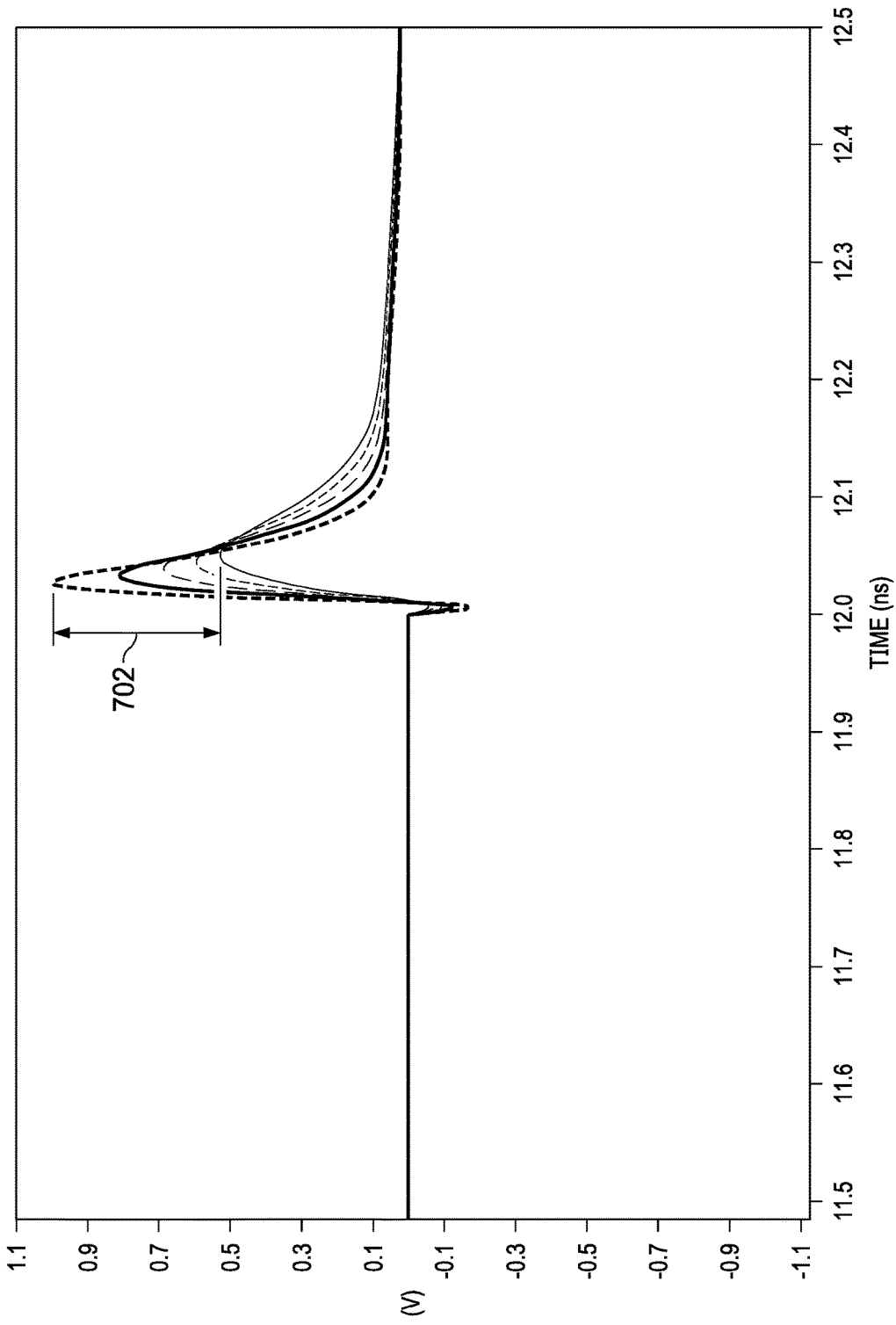
FIG. 7 shows a graph comparing receiver signal strength for an isolator device as a function of parasitic capacitance in accordance with various examples.

FIG. 7 shows a graph 700 comparing receiver signal strength for an isolator device as a function of parasitic capacitance in accordance with various examples. In graph 700, an isolation capacitance of 70 fF is assumed for each signal line. Also, the parasitic capacitance for each signal line varies between 25 fF-100 fF, resulting in different signal strengths corresponding to signal strength variance 702. By employing a receiver with a TIA topology (e.g., open-loop TIA topology 470A as in FIG. 4A, closed-loop TIA topology 470B as in FIG. 4B, or the TIA circuit components in FIG. 5) in an isolator device (e.g., device 100) as described herein, the signal strength variance 702 due to parasitic capacitance is reduced compared to isolator devices that do not employ a TIA-based receiver. The reduction of signal strength variance 702 improves receiver performance in an isolator device.

Figure 8:
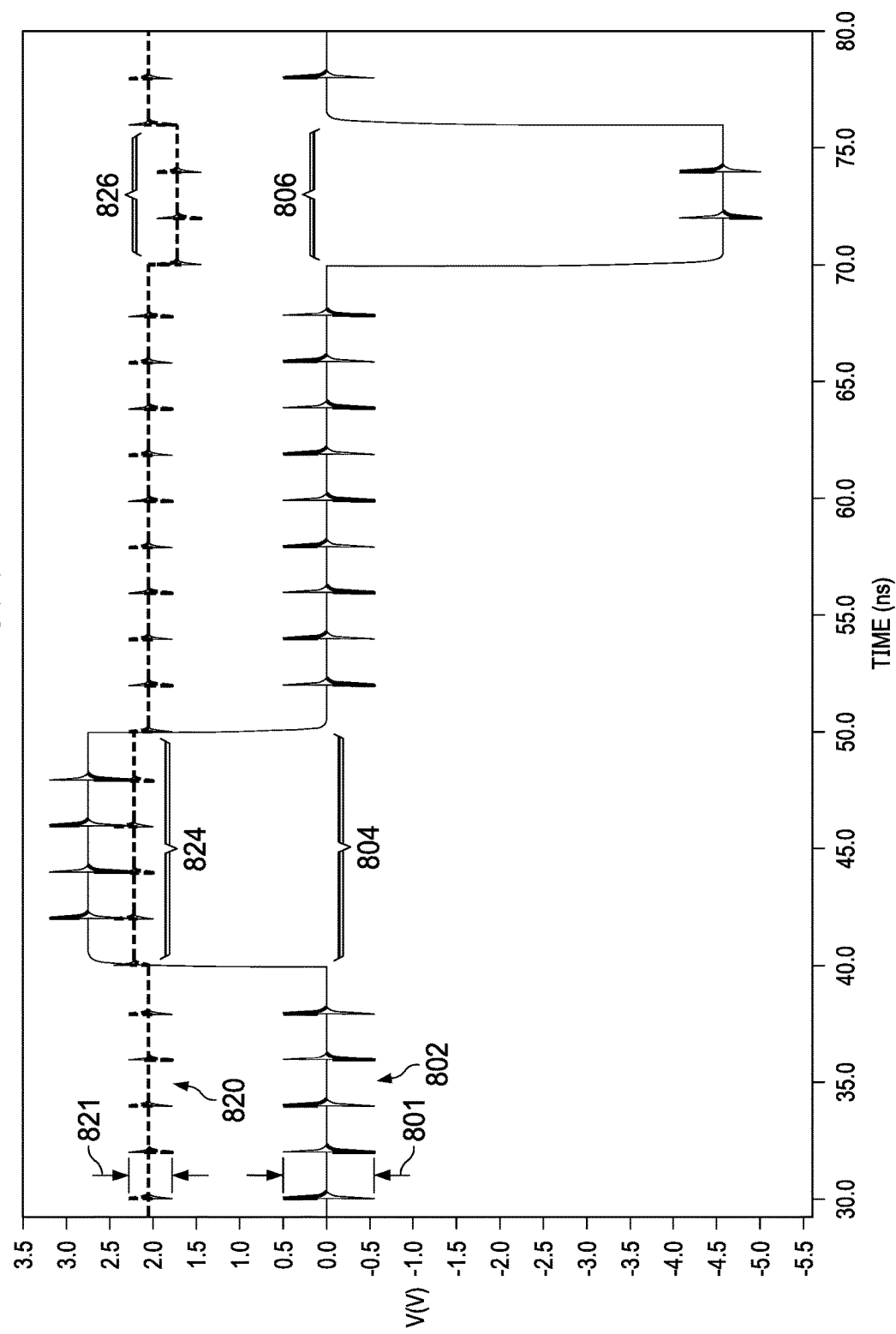
FIG. 8 shows a graph comparing receiver input signals for isolator devices with and without common-mode voltage regulation in accordance with various examples.

FIG. 8 shows a graph 800 comparing receiver input signals with and without common-mode voltage regulation in accordance with various examples. In graph 800, a first differential signal 802 corresponds to an isolator device without CM voltage regulation. The first differential signal 802 has a differential signal amplitude 801, and is sensitive to CM transients which alter the base voltage level (0V) for the first differential signal 802. More specifically, a first CM transient event 804 raises the base voltage level for the first differential signal 802 from 0V to approximately 2.7V for 10 ns. Later, a second CM transient event 806 lowers the base voltage level for the first differential signal 802 from 0V to approximately −4.5V for 6 ns. The first and second CM transient events 804 and 806 increase the difficulty of signal processing by receivers.

In contrast, a second differential signal 820 corresponds to an isolator device with CM voltage regulation. The second differential signal 820 has a differential signal amplitude 821 that is less than the differential signal amplitude 801 of the first differential signal 802. However, second differential signal 820 is less sensitive to CM transients. Thus, a first CM transient event 824 related to the second differential signal 820 only raises the base voltage level (2V) for the second differential signal 820 from 2V to approximately 2.2V for 10 ns. Later, a second CM transient event 826 lowers the base voltage level for the first differential signal 802 from 2V to approximately 1.7 for 6 ns. The first and second CM transient events 824 and 826 for the second differential signal 820 (smaller due to CM voltage regulation) are not as difficult for receivers to handle compared to the CM transient events 804 and 806 related to first differential signal 802 (larger due to no CM voltage regulation).

FIG. 9 shows a graph 900 comparing receiver output signals with and without common-mode voltage regulation in accordance with various examples. In graph 900, a first receiver output 902 corresponds to an isolator device without CM voltage regulation. As shown, the first receiver output 902 has gaps 902 and 906 of data missing due to CM transients (e.g., CM transient events 804 and 806 in FIG. 8). In contrast, the second receiver output 912 corresponds to an isolator device with CM voltage regulation. As shown, the second receiver output 912 has a signal variation region 914 due to CM transients (e.g., CM transient events 824 and 826 in FIG. 8), but the data in region 914 is still correct. Isolator devices with CM voltage regulation provide at least a threshold amount of common-mode transient immunity, which can reduce signaling errors and power consumption (by avoiding wasted signaling and/or data recovery techniques such as on-off keying.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An isolator device that comprises:
   a differential transmitter;
   a differential receiver;
   a pair of differential signal lines between the differential transmitter and the differential receiver; and
   isolation circuitry along the pair of differential signal lines, wherein the isolation circuitry includes a transmitter-side capacitor for each differential signal line, a receiver-side capacitor for each differential signal line, and at least one common-mode voltage regulation component.

2. The isolator device of claim 1, wherein the at least one common-mode voltage regulation component includes transmitter-side and receiver-side common-mode servo circuits, the transmitter-side common-mode servo circuit coupled between the differential transmitter and the transmitter-side isolation capacitors, and the receiver-side common-mode servo circuit coupled between the differential receiver and the receiver-side isolation capacitors.

3. The isolator device of claim 2, wherein each of the transmitter-side and receiver-side common-mode servo circuits comprises an active servo loop configured to detect common-mode transients and to source or sink current in response to a detected common-mode transient.

4. The isolator device of claim 1, wherein the at least one common-mode voltage regulation component includes transmitter-side and receiver-side common-mode chokes, the transmitter-side common-mode choke coupled between the differential transmitter and the transmitter-side isolation capacitors, and the receiver-side common-mode choke coupled between the differential receiver and receiver-side isolation capacitors.

5. The isolator device of claim 4, wherein each of the transmitter-side and receiver-side common-mode chokes comprises a passive component for each differential signal line to suppress common-mode transients at frequencies above a predetermined threshold.

6. The isolator device of claim 4, wherein the transmitter-side common-mode choke comprises an inductor for each differential signal line, and wherein the receiver-side common-mode choke comprises an inductor for each differential signal line.

7. The isolator device of claim 1, wherein the differential receiver comprises a transimpedance amplifier.

8. The isolator device of claim 7, wherein the transimpedance amplifier is an open-loop amplifier.

9. The isolator device of claim 7, wherein the transimpedance amplifier is a closed-loop amplifier.

10. An isolator device that comprises:
    a transmitter-side integrated circuit with a differential transmitter, a pair of differential transmitter signal lines, and a transmitter-side isolation capacitor for each differential transmitter signal line;
    a receiver-side integrated circuit with a differential receiver, a pair of differential receiver signal lines, and a receiver-side isolation capacitor for each differential receiver signal line;
    conductive wires between the transmitter-side integrated circuit and the receiver-side integrated circuit to couple the pair of differential transmitter signal lines to the pair of differential receiver signal lines; and
    at least one common-mode voltage regulation component.

11. The isolator device of claim 10, wherein the at least one common-mode voltage regulation component comprises at least one of a transmitter-side common-mode servo circuit and a receiver-side common-mode servo circuit.

12. The isolator device of claim 11, wherein each common-mode servo circuit comprises an active servo loop configured to detect common-mode transients and to source or sink current in response to a detected common-mode transient.

13. The isolator device of claim 10, wherein the at least one common-mode voltage regulation component comprises at least one of a transmitter-side common-mode choke and a receiver-side common-mode choke.

14. The isolator device of claim 13, wherein each common-mode choke comprises an inductor for each differential signal line, each inductor configured to suppress common-mode transients at frequencies above a predetermined threshold.

15. The isolator device of claim 10, wherein the differential receiver comprises an open-loop transimpedance amplifier (TIA) topology.

16. The isolator device of claim 10, wherein the differential receiver comprises a closed-loop transimpedance amplifier (TIA) topology.

17. An isolator device that comprises:
a receiver-side circuit having, for each of two differential signal lines,
first and second transimpedance amplifier (TIA) transistors, each having a control terminal, a first current terminal, and a second current terminal,
wherein the control terminal of the first TIA transistor couples to an input signal node,
wherein the first current terminal of the first TIA transistor couples to a voltage supply node via a resistor;
wherein the second current terminal of the first TIA transistor couples to a common-node current source for the receiver-side circuit,
wherein the control terminal of the second TIA transistor couples to a voltage supply node via a resistor,
wherein the first current terminal of the second TIA transistor couples to a voltage supply node,
wherein the second current terminal of the second TIA transistor couples to a current source and an output signal node,
wherein the second current terminal of the second TIA transistor also couples the input signal node via a resistor; and
a common-mode (CM) servo circuit having, a first CM servo transistor, a second CM servo transistor, and a third CM servo transistor.

18. The isolator device of claim 17, wherein the first CM servo transistor has a control terminal coupled to an input signal node, a first current terminal coupled to a voltage supply node via a resistor, and a second current terminal coupled to the common-node current source.

19. The isolator device of claim 18, wherein the second CM servo transistor has a control terminal coupled to the second current terminal of the first CM servo transistor, a first current terminal coupled to an input signal node, and a second current terminal coupled to a ground node.

20. The isolator device of claim 18, wherein the third CM servo transistor has a control terminal coupled to a bias circuit, a first current terminal coupled to a voltage supply node, and a second current terminal coupled to an input signal node.

* * * * *